(12) United States Patent
Chen et al.

(10) Patent No.: US 8,932,796 B2
(45) Date of Patent: Jan. 13, 2015

(54) HYBRID PHOTORESIST COMPOSITION AND PATTERN FORMING METHOD USING THEREOF

(75) Inventors: Kuang-Jung Chen, Poughkeepsie, NY (US); Wu-Song S. Huang, Brewster, NY (US); Sen Liu, Highland Park, NJ (US); Steven J. Holmes, Guilderland, NY (US); Gregory Breyta, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 13/293,672

(22) Filed: Nov. 10, 2011

(65) Prior Publication Data

US 2013/0122421 A1    May 16, 2013

(51) Int. Cl.

| | |
|---|---|
| *G03F 7/004* | (2006.01) |
| *G03F 7/20* | (2006.01) |
| *G03F 7/028* | (2006.01) |
| *G03F 7/038* | (2006.01) |
| *G03F 7/039* | (2006.01) |
| *G03F 7/095* | (2006.01) |

(52) U.S. Cl.
CPC ............... *G03F 7/203* (2013.01); *G03F 7/028* (2013.01); *G03F 7/0045* (2013.01); *G03F 7/0382* (2013.01); *G03F 7/0392* (2013.01); *G03F 7/095* (2013.01); *Y10S 430/114* (2013.01); *Y10S 430/128* (2013.01)
USPC .......................... 430/270.1; 430/913; 430/927

(58) Field of Classification Search
USPC ....................... 430/270.1, 913, 927
IPC ............ G03F 7/00,7/004, 7/0045, 7/027, 7/028
See application file for complete search history.

(56) References Cited

U.S. PATENT DOCUMENTS

| | | | |
|---|---|---|---|
| 5,738,972 A | 4/1998 | Padmanaban et al. | |
| 5,972,570 A | 10/1999 | Bruce et al. | |
| 5,981,148 A | 11/1999 | Brown et al. | |
| 6,007,968 A | 12/1999 | Furukawa et al. | |
| 6,022,666 A | 2/2000 | Hada et al. | |
| 6,043,003 A | 3/2000 | Bucchignano et al. | |
| 6,114,082 A | 9/2000 | Hakey et al. | |
| 6,200,726 B1 | 3/2001 | Chen et al. | |
| 6,338,934 B1 | 1/2002 | Chen et al. | |
| 7,435,526 B2 | 10/2008 | Kodama et al. | |
| 7,449,277 B2 * | 11/2008 | Hatakeyama et al. | ..... 430/270.1 |
| 7,592,125 B2 * | 9/2009 | Suzuki et al. | .............. 430/270.1 |
| 7,635,553 B2 | 12/2009 | Tartani | |
| 7,776,512 B2 | 8/2010 | Kodama et al. | |
| 7,807,329 B2 | 10/2010 | Mizutani et al. | |
| 8,003,295 B2 * | 8/2011 | Hatakeyama | .............. 430/270.1 |
| 8,043,795 B2 * | 10/2011 | Iwashita | ....................... 430/312 |
| 2003/0039916 A1 | 2/2003 | Adegawa et al. | |
| 2008/0096134 A1 * | 4/2008 | Sugimoto et al. | .......... 430/287.1 |
| 2009/0226843 A1 * | 9/2009 | Hatakeyama et al. | ..... 430/286.1 |
| 2010/0068650 A1 * | 3/2010 | Nishimura et al. | ......... 430/280.1 |
| 2011/0183262 A1 * | 7/2011 | Kusaki et al. | .............. 430/270.1 |
| 2011/0254178 A1 * | 10/2011 | Matsutani et al. | ............ 257/788 |

FOREIGN PATENT DOCUMENTS

| | | |
|---|---|---|
| KR | 20010051519 | 6/2001 |
| KR | 20040061565 A | 7/2004 |

OTHER PUBLICATIONS

PCT International Search Report and Written Opinion Application No. PCT/US2012/063234 International Filing Date: Nov. 2, 2012.

* cited by examiner

*Primary Examiner* — Amanda C Walke
(74) *Attorney, Agent, or Firm* — Steven Kellner; Yuanmin Cai

(57) ABSTRACT

The present invention relates to a hybrid photoresist composition for improved resolution and a pattern forming method using the photoresist composition. The photoresist composition includes a radiation sensitive acid generator, a crosslinking agent and a polymer having a hydrophobic monomer unit and a hydrophilic monomer unit containing a hydroxyl group. At least some of the hydroxyl groups are protected with an acid labile moiety having a low activation energy. The photoresist is capable of producing a hybrid response to a single exposure. The patterning forming method utilizes the hybrid response to form a patterned structure in the photoresist layer. The photoresist composition and the pattern forming method of the present invention are useful for printing small features with precise image control, particularly spaces of small dimensions.

18 Claims, No Drawings

HYBRID PHOTORESIST COMPOSITION AND PATTERN FORMING METHOD USING THEREOF

FIELD OF THE INVENTION

This invention relates generally to photolithography, and more particularly to a hybrid photoresist composition having both positive and negative characteristics. This invention is also directed to a pattern forming method of using such a photoresist composition.

BACKGROUND OF THE INVENTION

Photolithography is a type of lithographic process used in the manufacturing of semiconductor devices, integrated optics and photomasks. In a photolithography process, a light is used to transfer a geometric pattern from a photomask to a substrate such as a silicon wafer. A photoresist layer is first formed on the substrate. The substrate is baked to remove any solvent remained in the photoresist layer. The photoresist is then exposed through a photomask with a desired pattern to a source of actinic radiation such as ultraviolet (UV), extreme ultraviolet (EUV), electron beams, or X-rays. The radiation exposure causes a chemical reaction in the exposed areas of the photoresist and creates a latent image corresponding to the mask pattern in the photoresist layer. The photoresist is next developed in a developer solution, usually an aqueous base solution, to form a pattern in the photoresist layer. The patterned photoresist can then be used as a mask for subsequent fabrication processes on the substrate, such as deposition, etching, or ion implantation processes.

Conventionally, there are two types of photoresist: positive resist and negative resist. They are characterized by a dissolution curve in which there is a single transition from a first dissolution rate to a second dissolution rate as the photoresist is exposed to increasing levels of actinic radiation. A positive resist is initially insoluble in the developer solution. After exposure, the exposed region of the resist becomes soluble in the developer solution. A negative resist behaves in the opposite manner. The negative resist is initially soluble in the developer solution. Exposure to radiation typically initiates a crosslinking reaction which causes the exposed region of the negative resist to become insoluble in the developer solution. For both positive and negative photoresists, the soluble areas of the photoresist essentially dissolve in the developer to become spaces, while the insoluble areas remain as lines of the photoresist in a subsequent development step.

As semiconductor ground rule gets smaller, the need for printing a large number of lines and spaces in a given area has increased dramatically. In response, the semiconductor industry has taken several efforts to increase the resolution of a photolithography process. For example, phase shift masks, shorter wavelength exposure tools, immersion lithography, higher numerical aperture exposure tools, and tools with selective illumination systems are continuing to be developed to improve the pattern density of integrated circuits. However, all these approaches mentioned above come with high cost. In addition, it has become ever more challenging to print small space features such as trenches and vias of small dimensions with precise image control using conventional positive or negative photoresist due to the poor optical image contrast of the masks used to create these features. Therefore, there is a need for a photoresist composition and a pattern forming method that can achieve improved resolution with relatively low cost and can print small features with precise image control, particularly spaces of small dimensions.

SUMMARY OF THE INVENTION

The present invention provides a photoresist composition which is capable of having both positive and negative characteristics for improved resolution. This invention also provides a pattern forming method which is capable of printing spaces of small dimensions.

In one aspect, the present invention relates to a hybrid photoresist composition. The composition includes a radiation sensitive acid generator, a crosslinking agent and a polymer having a hydrophobic monomer unit and a hydrophilic monomer unit containing a hydroxyl group. At least some of the hydroxyl groups are protected with an acid labile moiety having a low activation energy. The photoresist is capable of producing a hybrid response to a single exposure such that: a first portion of the photoresist that is unexposed during the single exposure is insoluble in a developer; a second portion of the photoresist that is exposed to a first actinic energy level of the single exposure is also insoluble in the developer; and a third portion of the photoresist that is exposed to a second actinic energy level that is less than the first actinic energy level during the single exposure becomes soluble in the developer.

In another aspect, the present invention relates to a method of forming a patterned structure on a substrate. The method includes the steps of: providing a substrate with a material layer; applying a photoresist composition to the substrate to form a photoresist layer on the material layer, the photoresist composition comprising a radiation sensitive acid generator, a crosslinking agent and a polymer having a hydrophobic monomer unit and a hydrophilic monomer unit containing a hydroxyl group, wherein at least some of the hydroxyl groups are protected with an acid labile moiety having a low activation energy and wherein the photoresist is capable of producing a hybrid response to a single exposure such that: a first portion of the photoresist that is unexposed during the single exposure is insoluble in a developer; a second portion of the photoresist that is exposed to a first actinic energy level of the single exposure is also insoluble in the developer; and a third portion of the photoresist that is exposed to a second actinic energy level that is less than the first actinic energy level during the single exposure becomes soluble in the developer; patternwise exposing the photoresist layer to radiation; and removing a portion of the photoresist layer with the developer to form the patterned feature in the photoresist layer.

DETAILED DESCRIPTION OF PREFERRED EMBODIMENTS

It will be understood that when an element, such as a layer, is referred to as being "on" or "over" another element, it can be directly on the other element or intervening elements may also be present. In contrast, when an element is referred to as being "directly on" or "directly over" another element, there are no intervening elements present.

As the feature size becomes smaller and smaller, it has become more difficult to print features with precise image control, particularly spaces of small dimensions using traditional positive or negative photoresists. The present invention provides a photoresist composition with improved resolution which can be used to print spaces of small dimensions with relatively low cost. The composition in the present invention is capable of producing a combination of a positive tone response and a negative tone response (a hybrid response) to a single exposure. At a lower energy level of the exposure (e.g., in the partially exposed area), the positive tone response dominates. As a result, the area of the photoresist which is partially exposed becomes soluble in a developer. At a higher energy level of the exposure (e.g., in the fully exposed area), the negative tone response predominates. The area of the photoresist exposed with the higher energy level then becomes insoluble in the developer. In the meantime, the area of the photoresist which is unexposed during the single exposure remains insoluble in the developer. Thus, unlike the conventional positive tone or negative tone photoresist which produces a single space/line pair for a single aerial image, the hybrid photoresist of the present invention allows the single aerial image to be printed as a line/space/line/space combination. This "frequency doubling" effect of the hybrid photoresist improves the resolution of the conventional positive tone or negative tone photoresist and allows spaces of small dimensions to be printed.

In one embodiment, the photoresist composition of the present invention includes a radiation sensitive acid generator, a crosslinking agent and a polymer having a hydrophobic monomer unit and a hydrophilic monomer unit containing a hydroxyl group. The radiation sensitive acid generator, also known as photoacid generator (PAG), is a compound that generates an acid upon exposure to radiation. The PAG of the present invention may be one of an onium salt, a succinimide derivative, a diazo compound, a nitrobenzyl compound, and the like.

A preferred PAG that may be employed in the present invention is an onium salt, such as an iodonium salt or a sulfonium salt, and/or a succinimide derivative. In various exemplary embodiments of the present invention, the preferred PAG may include 4-(1-butoxynaphthyl)tetrahydrothiophenium perfluorobutanesulfonate, triphenyl sulfonium triflate, triphenyl sulfonium perfluorobutanesulfonate, t-butylphenyl diphenyl sulfonium perfluorobutanesulfonate, 4-(1-butoxynaphthyl)tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl) iodonium perfluorohexane sulfonate, di(t-butylphenyl) iodonium perfluoroethylcyclohexane sulfonate, di(t-buylphenyl)iodonium camphoresulfonate, and perfluorobutylsulfonyloxybicylo[2.2.1]-hept-5-ene-2,3-dicarboximide. Any of these PAGs may be used singly or in a mixture of two or more. Both fluorinated and fluorine-free PAGs can be used in the present invention.

The specific PAG selected will depend on the irradiation being used for patterning the photoresist. PAGs are currently available for a variety of different wavelengths of light from the visible range to the extreme UV range. Preferably, the PAG is one suitable for use in 248 nm lithography.

The photoresist composition also includes a crosslinking agent. The crosslinking agent can react with the polymer, especially the hydroxyl group of the hydrophilic monomer unit, in a manner to interlink the polymer chains. Generally, the crosslinking agent of the photoresist composition of the present invention is any suitable crosslinking agent known in the negative photoresist art which is compatible with the other selected components of the composition. The crosslinking agent typically acts to crosslink the polymer in the presence of a generated acid. Typical crosslinking agents are glycoluril compounds such as tetramethoxymethyl glycoluril, methylpropyltetramethoxymethyl glycoluril, and methylphenyltetramethoxymethyl glycoluril, available under the POWDER-LINK® trademark from Cytec Industries. Other possible crosslinking agents include: 2,6-bis(hydroxymethyl)-p-cresol compounds such as those disclosed in Japanese Laid-Open Patent Application (Kokai) No. 1-293339, etherified amino resins, for example, methylated or butylated melamine resins (N-methoxymethyl- or N-butoxymethyl-melamine respectively), and methylated/butylated glycolurils, for example as disclosed in Canadian Patent No. 1 204 547. Other crosslinking agents such as bis-epoxies or bis-phenols (e.g., bisphenol-A) may also be used. Combinations of two or more crosslinking agents may be preferred in some embodiments.

Some particular examples of crosslinking agents suitable for use in the photoresist composition according to the present invention include:

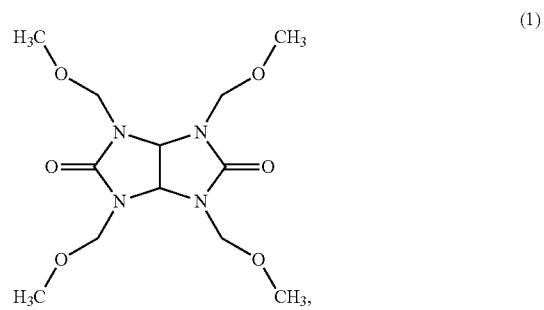

(1)

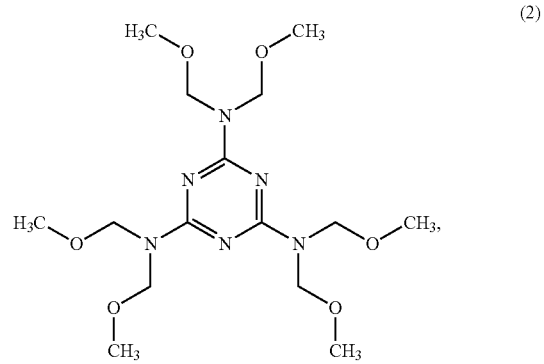

(2)

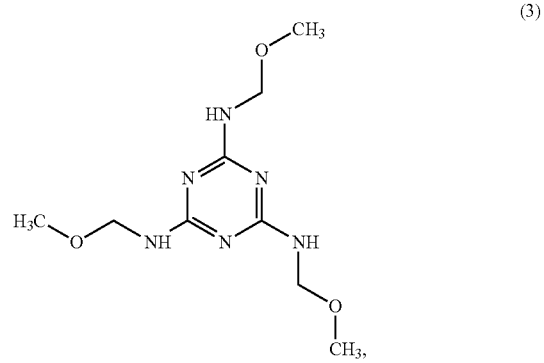

(3)

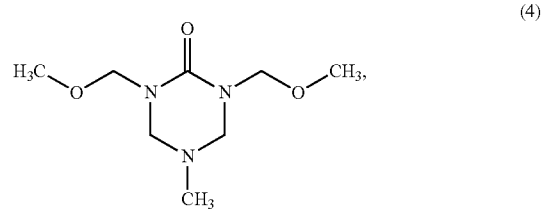

(4)

-continued

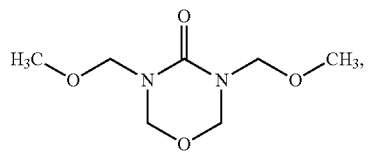  (5)

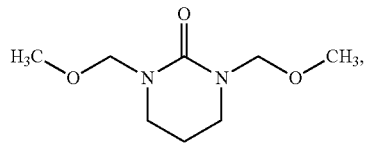  (6)

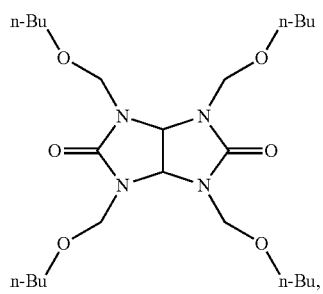  (7)

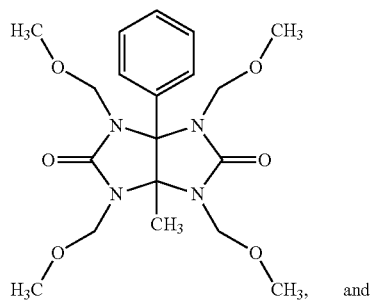  (8)

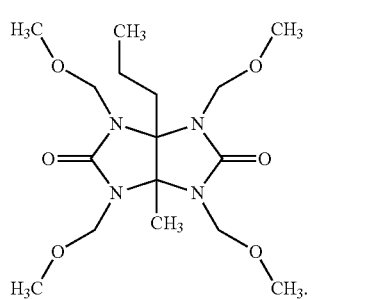  (9)

The hydrophobic monomer unit and the hydrophilic monomer unit of the polymer of the present invention are derived from monomers having a polymerizable moiety. Examples of the polymerizable moiety may include:

  (10)

where $R_1$ represents hydrogen, a linear or branched alkyl group of 1 to 20 carbons, a semi- or perfluorinated linear or branched alkyl group of 1 to 20 carbons, or CN; and

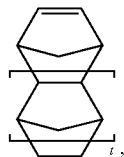  (11)

where t is an integer from 0 to 3.

The hydrophobic monomer unit of the polymer preferably does not contain any polar groups such as hydroxyl and carboxylic acid groups. Some particular examples of hydrophobic monomers suitable for use in the photoresist composition according to the present invention include:

  (12)

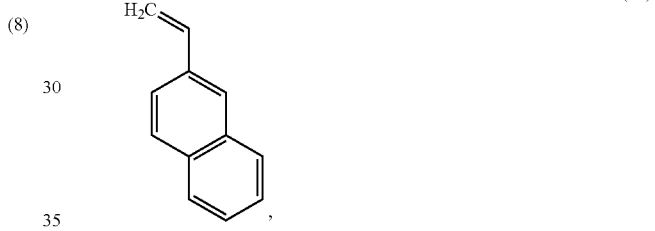  (13)

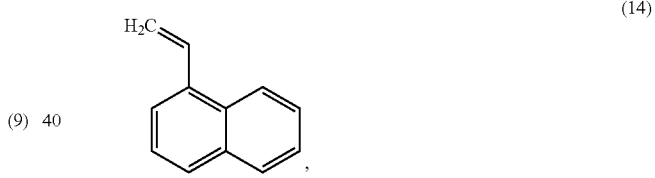  (14)

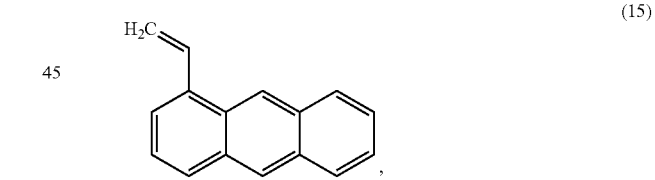  (15)

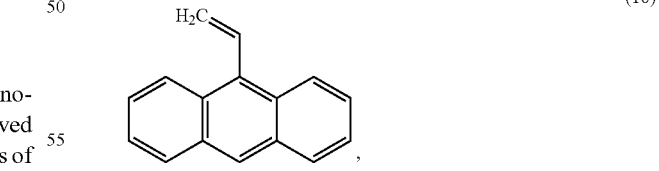  (16)

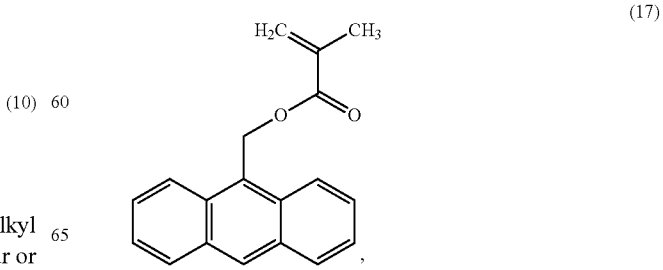  (17)

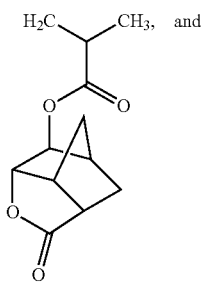 (18)

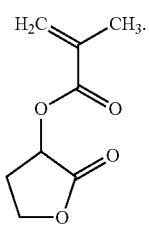 (19)

The concentration of the hydrophobic monomer unit in the polymer is typically from about 7 mole % to about 60 mole %. More preferably, the concentration of the hydrophobic monomer unit is from about 10 mole % to about 50 mole %, with from about 15 mole % to about 30 mole % being most preferred.

It is preferred that the hydrophilic monomer unit of the polymer contains at least one hydroxyl group. The hydroxyl group increases the polarity of the hydrophilic monomer unit. In addition, the hydroxyl group can react with the crosslinking agent in the presence of a generated acid to crosslink the polymer chains. Some particular examples of hydrophilic monomers suitable for use in the photoresist composition according to the present invention include:

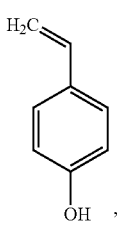 (20)

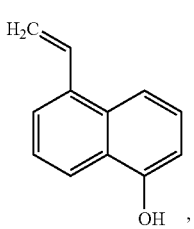 (21)

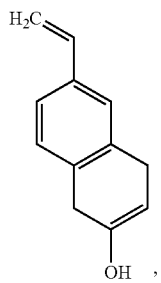 (22)

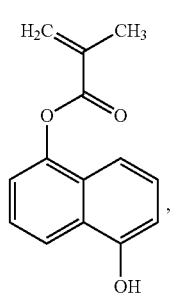 (23)

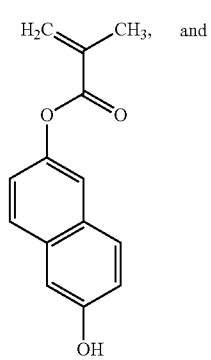 (24)

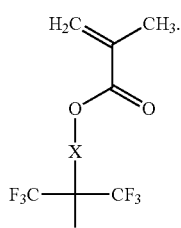 (25)

where X represents a liner or branched aliphatic chain with 1-12 carbons or a cyclic aliphatic ring of 1-10 carbons.

It is preferred that at least some of the hydroxyl groups on the hydrophilic monomer units are protected with an acid labile moiety having a low activation energy. The acid labile moiety may be one of an acetal, a ketal and an orthoester. Some particular examples of hydrophilic monomers protected with an acid labile moiety suitable for use in the photoresist composition according to the present invention include:

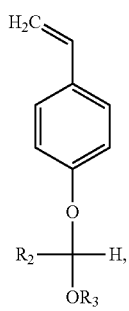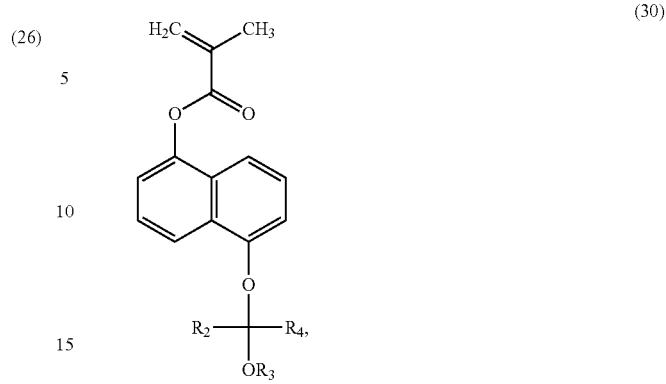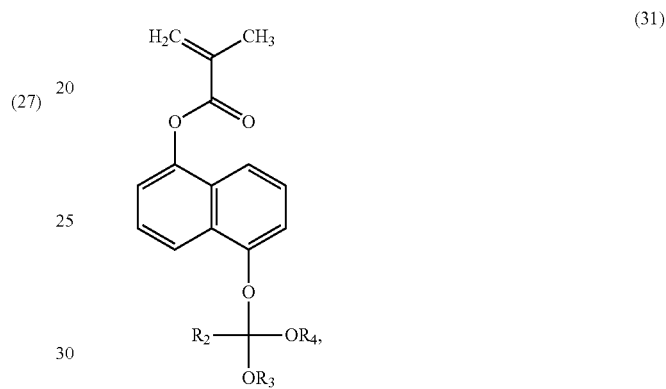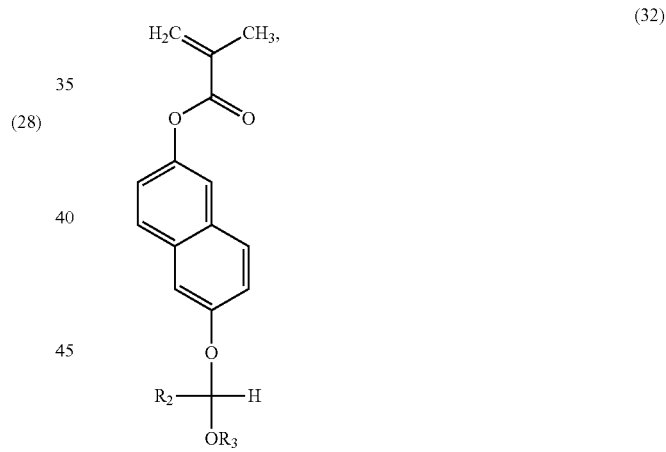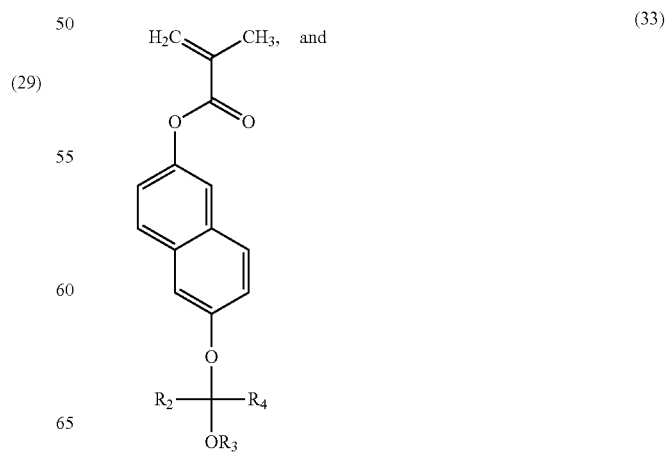

-continued

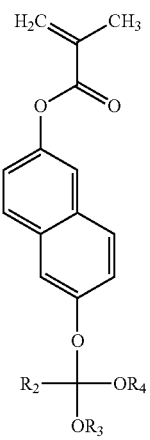

(34)

where $R_2$, $R_3$ and $R_4$ each independently represents a liner or branched aliphatic chain with 1-12 carbons or a cyclic aliphatic ring of 1-10 carbons.

It is preferred that from about 7 mole % to about 100 mole % of the hydroxyl groups are protected by the acid labile moiety. More preferably, from about 10 mole % to about 50 mole % of the hydroxyl groups are protected by the acid labile moiety, with from about 15 mole % to about 35 mole % being most preferred. Preferably, the hydroxyl groups of the hydrophilic monomer units are protected by the acid labile moiety after the polymer is formed.

Optionally, the polymer of the present invention may include other monomer unit or units which allow for further regulation of, for example, dissolution properties, thermal properties, and etch resistance in various exemplary embodiments.

The polymer of the present invention is preferably initially insoluble in a developer, such as an aqueous base developer. More preferably, the polymer is initially insoluble in a tetramethylammonium hydroxide (TMAH) aqueous developer with a concentration of about 0.26 N.

The photoresist composition of the present invention may further include a solvent, and other performance enhancing additives, for example, a quencher and a surfactant. Solvents well known to those skilled in the art may be employed in the photoresist composition of various exemplary embodiments of the present invention. Such solvents may be used to dissolve the polymer and other components of the photoresist composition. Illustrative examples of such solvents may include, but are not limited to: ethers, glycol ethers, aromatic hydrocarbons, ketones, esters and the like. A solvent system including a mixture of the aforementioned solvents is also contemplated. Suitable glycol ethers include: 2-methoxyethyl ether (diglyme), ethylene glycol monomethyl ether, propylene glycol monomethyl ether, propylene glycol monomethylether acetate (PGMEA) and the like. Suitable aromatic hydrocarbon solvents include: toluene, xylene, and benzene. Examples of ketones include: methylisobutylketone, 2-heptanone, cycloheptanone, and cyclohexanone. An example of an ether solvent is tetrahydrofuran, whereas ethyl lactate and ethoxy ethyl propionate are examples of ester solvents that may be employed in the present invention.

The quencher that may be used in the photoresist composition of the present invention may comprise a quencher that scavenges trace acids, while not having an excessive impact on the performance of the photoresist. The quencher is preferably a weak base. Illustrative examples of quenchers that can be employed in the present invention include, but are not limited to: aliphatic amines, aromatic amines, carboxylates, hydroxides, or combinations thereof and the like.

The optional surfactants that can be employed in the photoresist compositions include any surfactant that is capable of improving the coating homogeneity of the chemically amplified photoresist composition of the present invention. Illustrative examples include: fluorine-containing surfactants such as 3M's FC-4430® and siloxane-containing surfactants such as Union Carbide's Silwet® series.

In addition to the above components, the photoresist composition may also include other components and/or additives such as photosensitizers. Illustrative examples of photosensitizers which can be used in the present invention include, but are not limited to: 9-anthracene methanol, coumarins, 9,10-bis(trimethoxysily ethynyl) anthracene and polymers containing these chromophores.

In various exemplary embodiments of the present invention, the photoresist composition of the invention may include: about 1 to about 30 wt. % of the polymer, more preferably about 3 to about 15 wt. %; about 0.5 to about 30 wt. % of the radiation sensitive acid generator, based on the total weight of the polymer, more preferably about 1 to about 15 wt. %; about 1 to about 30 wt. % of the crosslinking agent, based on the total weight of the polymer, more preferably about 2 to about 15 wt. %; and a solvent, which may typically be present in amounts of about 70 to about 99 wt. % of the photoresist composition, more preferably about 85 to about 98 wt. %.

In various exemplary embodiments, the photoresist composition may further comprise a quencher, which may typically be present in amounts of about 0.1 to about 10.0 wt. % based on the total weight of the polymer, and a surfactant, which may typically be present in amounts of about 0.001 to about 1.0 wt. %, based on the total weight of the polymer. When a photosensitizer is employed, it is preferably present in amounts of about 0.001 to about 8 weight %, based on the total weight of the polymer.

Note that the amounts given above are exemplary and that other amounts of each of the above components, which are typically employed in the photolithography industry, can also be employed herein.

The photoresist composition is preferably initially insoluble in a developer, such as an aqueous base developer. More preferably, the photoresist composition is initially insoluble in a tetramethylammonium hydroxide (TMAH) aqueous developer with a concentration of about 0.26 N, a widely used developer for photolithography in the semiconductor industry. Therefore, the photoresist composition of the present invention is compatible with the 0.26 N TMAH developer.

Upon exposure to a single exposure, the photoresist of the present invention is capable of producing a hybrid response to the exposure: a first portion of the photoresist that is unexposed during the single exposure is insoluble in a developer; a second portion of the photoresist that is exposed to a first actinic energy level of the single exposure is also insoluble in the developer; and a third portion of the photoresist that is exposed to a second actinic energy level that is less than the first actinic energy level during the single exposure becomes soluble in the developer.

The radiation employed for the exposure in the present invention can be visible light, ultraviolet (UV), extreme ultraviolet (EUV) and electron beam (E-beam). It is preferred that the imaging wavelength of the radiation is about 248 nm, 193 nm or 13 nm. It is more preferred that the imaging wavelength of the radiation is about 248 nm.

The present invention also encompasses a method of using the photoresist composition described above to form a patterned structure on a substrate. In one embodiment, such a method includes the steps of: providing a substrate with a material layer; applying a photoresist composition to the substrate to form a photoresist layer on the material layer, the photoresist composition comprising a radiation sensitive acid generator, a crosslinking agent and a polymer having a hydrophobic monomer unit and a hydrophilic monomer unit containing a hydroxyl group, wherein at least some of the hydroxyl groups are protected with an acid labile moiety having a low activation energy and wherein the photoresist is capable of producing a hybrid response to a single exposure such that: a first portion of the photoresist that is unexposed during the single exposure is insoluble in a developer; a second portion of the photoresist that is exposed to a first actinic energy level of the single exposure is also insoluble in the developer; and a third portion of the photoresist that is exposed to a second actinic energy level that is less than the first actinic energy level during the single exposure becomes soluble in the developer; patternwise exposing the photoresist layer to radiation; and removing a portion of the photoresist layer with the developer to form the patterned feature in the photoresist layer.

The substrate is suitably any substrate conventionally used in processes involving photoresists. For example, the substrate can be silicon, silicon oxide, aluminum-aluminum oxide, gallium arsenide, ceramic, quartz, copper or any combination thereof, including multilayers. The substrate can include one or more semiconductor layers or structures and can include active or operable portions of semiconductor devices.

The material layer may be a metal conductor layer, a ceramic insulator layer, a semiconductor layer or other material depending on the stage of the manufacture process and the desired material set for the end product. The photoresist composition of the invention is especially useful for lithographic processes used in the manufacture of integrated circuits on semiconductor substrates. The photoresist composition of the invention can be used in lithographic processes to create patterned material layer structures such as metal wiring lines, holes for contacts or vias, insulation sections (e.g., damascene trenches or shallow trench isolation), trenches for capacitor structures, ion implanted semiconductor structures for transistors, etc. as might be used in integrated circuit devices.

In some cases, a bottom antireflective coating and/or underlayer coating (e.g., a planarizing underlayer) may be applied between the photoresist layer and the material layer. In other cases, a top antireflective coating layer may be applied over the photoresist layer. The invention is not limited to the use of antireflective reflective coatings and/or underlayer materials, nor specific compositions of those coatings or materials.

The photoresist layer may be formed by virtually any standard means including spin coating. The photoresist layer may be baked (post applying bake (PAB)) to remove any solvent from the photoresist and improve the coherence of the photoresist layer. The preferred range of the PAB temperature for the photoresist layer is from about 60° C. to about 150° C., more preferably from about 80° C. to about 130° C. The preferred range of thickness of the first layer is from about 20 nm to about 400 nm, more preferably from about 30 nm to about 300 nm.

The photoresist layer is then patternwise exposed to the desired radiation. The radiation can be visible light, UV, EUV and E-beam. It is preferred that the imaging wavelength of the radiation is about 248 nm, 193 nm or 13 nm, more preferably about 248 nm. The patternwise exposure is conducted through a mask which is placed over the photoresist layer. The exposure produces a hybrid response in the photoresist, as described above: a first portion of the photoresist that is unexposed during the exposure is insoluble in a developer; a second portion of the photoresist that is exposed to a first actinic energy level of the exposure is also insoluble in the developer; and a third portion of the photoresist that is exposed to a second actinic energy level that is less than the first actinic energy level during the exposure becomes soluble in the developer.

The second portion is usually a fully exposed area of the photoresist during the exposure. In the fully exposed area, the negative tone behavior of the photoresist dominates. In one embodiment, the negative tone behavior is produced by the reaction of the crosslinking agent with the hydroxyl group of the hydrophilic monomer unit of the polymer, catalyzed by the photo-generated acid. The reaction causes the polymer chains to be crosslinked and renders the photoresist insoluble in the developer.

The third portion is typically a partially exposed area during the exposure. In the partially exposed area, the positive tone behavior of the photoresist predominates. In one embodiment, the positive tone behavior is caused by the de-protection of the protected hydroxyl group of the hydrophilic monomer unit. The de-protection reaction removes the acid-labile moiety from the hydroxyl group and renders the photoresist soluble in the developer.

A bake (post exposure bake (PEB)) may be needed after the desired patternwise exposure to complete the acid-catalyzed reaction(s) and to produce the hybrid response. The preferred range of the PEB temperature is from about 60° C. to about 150° C., more preferably from about 80° C. to about 130° C. The PEB is preferably conducted for about 30 seconds to 5 minutes.

After PEB, if any, the photoresist structure with the desired pattern is obtained (developed) by contacting the photoresist layer with a developer. The developer is preferably an aqueous base developer, more preferably a TMAH aqueous developer with a concentration of about 0.26 N. The developer selectively removes the portion of the photoresist which is soluble in the developer. In one embodiment, the portion that is removed by the developer is the third portion of the photoresist that is exposed to the second actinic energy level.

The pattern from the photoresist structure may then be transferred to the underlying material layer of the substrate by etching with a suitable etchant using techniques known in the art; preferably the transfer is done by reactive ion etching or by wet etching. Once the desired pattern transfer has taken place, any remaining photoresist may be removed using conventional stripping techniques. Alternatively, the pattern may be transferred by ion implantation to form a pattern of ion implanted material.

Examples of general lithographic processes where the composition of the invention may be useful are disclosed in U.S. Pat. Nos. 4,855,017; 5,362,663; 5,429,710; 5,562,801; 5,618,751; 5,744,376; 5,801,094; 5,821,469 and 5,948,570. Other examples of pattern transfer processes are described in Chapters 12 and 13 of "Semiconductor Lithography, Principles, Practices, and Materials" by Wayne Moreau, Plenum Press, (1988). It should be understood that the invention is not limited to any specific lithography technique or device structure.

The invention is further described by the examples below. The invention is not limited to the specific details of the examples.

Example 1

Synthesis of Poly(4-hydroxystyrene-co-4-(1-methoxycyclohexyloxy)styrene-co-styrene) (58:22:20) in PGMEA Poly(4-hydroxystyrene-co-styrene) (random copolymer with 80/20 of HS/S, available from Nippon Soda Co., LTD) (20 g) was dissolved in propylene glycol monomethyl ether acetate (PGMEA) (105 g, available from Pacific PAC Inc.) in a 250 mL 3-neck round bottom flask with magnetic stirring and nitrogen atmosphere. Nitrogen was then blown through one side neck to the other side neck in the hood with magnetic stirring overnight. The solution lost 30 g of the solvent during this process. To this was added 1-methoxycyclohexene (6.7 g) followed by oxalic acid (20 mg). All three necks were then sealed with rubber septa and stirred overnight at room temperature. The next morning $^{13}$C-NMR of an aliquot of the reaction solution was diluted with deuterated acetone and was used to determine the degree of methoxycyclohexane (MOCH) incorporation. 27 mole % of the hydroxyl groups (i.e., 22 mole % based on all monomer units of the polymer) were found to be protected with MOCH. Activated basic alumina, Brokman I from Aldrich Chemical Company Inc. (6 g) was added to neutralize the oxalic acid catalyst and stabilize the solution. The concentration of the polymer solution at this point was calculated to be 25%, which was used as the basis for formulating the photoresist.

Example 2

Synthesis of Poly(4-hydroxystyrene-co-4-(1-methoxycyclohexyloxy)styrene-co-styrene) (69:16:15) in PGMEA Poly(4-hydroxystyrene-co-styrene) (random copolymer with 85/15 of HS/S, available from Nippon Soda Co., LTD) (75 g) was dissolved in PGMEA (195 g, available from General Chemicals Corp.) in a 500 mL 3-neck round bottom flask with magnetic stirring and nitrogen atmosphere. To this was added 1-methoxycyclohexene (16.5 g) followed by oxalic acid dihydrate (21 mg). The reaction solution was stirred overnight under nitrogen atmosphere at room temperature. The next morning $^{13}$C-NMR of an aliquot of the reaction solution was diluted with deuterated acetone and was used to determine the degree of MOCH incorporation. 16.7 mole % of the hydroxyl groups were found to be protected with MOCH.

Additional 1-methoxycyclohexene (3.1 g) was added and the reaction solution was stirred 5.5 hours under nitrogen atmosphere. The reaction was quenched with activated basic alumina, Brokman I from Aldrich Chemical Company Inc. (20 g). $^{13}$C-NMR was again used to determine the degree of MOCH incorporation. 19.2 mole % of the hydroxyl groups (i.e., 16 mole % based on all monomer units of the polymer) were found to be protected with MOCH. The concentration of the polymer solution at this point was calculated to be 30.1%, which was used as the basis for formulating the photoresist.

Example 3

Synthesis of Poly(4-hydroxystyrene-co-4-(1-methoxycyclohexyloxy)styrene-co-styrene) (68:17:15) in PGMEA Poly(4-hydroxystyrene-co-styrene) (random copolymer with 85/15 of HS/S, available from Nippon Soda Co., LTD) (75 g) was dissolved in PGMEA (195 g, available from General Chemicals Corp.) in a 500 mL 3-neck round bottom flask with magnetic stirring and nitrogen atmosphere. To this was added 1-methoxycyclohexene (16.5 g) followed by oxalic acid dihydrate (21 mg). The reaction solution was stirred overnight under nitrogen atmosphere at room temperature. The next morning $^{13}$C-NMR of an aliquot of the reaction solution was diluted with deuterated acetone and was used to determine the degree of MOCH incorporation. 14.3 mole % of the hydroxyl groups were found to be protected with MOCH.

Additional 1-methoxycyclohexene (4.5 g) was added and the reaction solution was stirred overnight under nitrogen atmosphere. The reaction was quenched with activated basic alumina, Brokman I from Aldrich Chemical Company Inc. (20 g). $^{13}$C-NMR was again used to determine the degree of MOCH incorporation. 20.0 mole % of the hydroxyl groups (i.e., 17 mole % based on all monomer units of the polymer) were found to be protected with MOCH. The concentration of the polymer solution at this point was calculated to be 30.7%, which was used as the basis for formulating the photoresist.

Example 4

Resist a Formulation

The following compositions were dissolved in PGMEA solvent available from Pacific Pac, Inc., Hollister, Calif. containing 500 ppm of FC-430, a non-ionic fluorinated alkyl ester surfactant available from 3M, St. Paul, Minn. for a total of 4.3% solids:
- Poly(4-hydroxystyrene-co-4-(1-methoxycyclohexyloxy) styrene-co-styrene) (58:22:20) in PGMEA, 89.7% of solids;
- triphenyl sulfonium triflate (TPSTf), 2.2% of solids;
- Di(t-butylphenyl)iodonium camphorsonate (TBIC), 2.2% of solids;
- tetramethoxymethyl glycouril (Powderlink), 5.4% of solids; and
- tetrabutyl ammonium hydroxide (TBAH) base, 0.5% of solids.

The solution was filtered through a 0.2 µm filter. The solution was coated onto a silicon wafer which was pre-coated with 35 nm of SHB-A940, available from Shin-Etsu Chemical Co., Ltd., on top of 200 nm HM8006, available from Japan Synthetic Rubber Co., Ltd., with a soft bake of 105 Celsius (° C.) for 60 sec resulting in films of about 120 nm thick. The coated wafer was then exposed to 248 nm wavelength light on an ASML stepper with a binary reticle using 0.6 NA and 0.6 sigma illumination condition. The wafer was then baked at 105° C. for 60 seconds. It was developed using a 30 seconds single puddle develop process with 0.263 N TMAH developer. A 60 nm space width was obtained.

Example 5

Resist B Formulation

This formulation was prepared and processed in a manner similar to Example 4. However, it is comprised of the following components:
- Poly(4-hydroxystyrene-co-4-(1-methoxycyclohexyloxy) styrene-co-styrene) (58:22:20) in PGMEA, 89.6% of solids;
- TPSTf, 3.0% of solids;
- TBIC, 1.5% of solids;

Powderlink, 5.4% of solids; and
TBAH, 0.5% of solids; and
sufficient PGMEA containing 500 ppm FC-430 surfactant as a solvent to form a 4.3% solids solution.

The solution was filtered through a 0.2 µm filter. The solution was coated onto silicon wafers which was pre-coated with 35 nm of SHB-A940, available from Shin-Etsu Chemical Co., Ltd., on top of 200 nm HM8006, available from Japan Synthetic Rubber Co., Ltd., with a soft bake of 105 Celsius (° C.) for 60 sec resulting in films of about 120 nm thick. The coated wafer was then exposed to 248 nm wavelength light on an ASML stepper with a binary reticle using 0.6 NA and 0.6 sigma illumination condition. The wafer was then baked at 105° C. for 60 seconds. It was developed using a 30 seconds single puddle develop process with 0.263 N TMAH developer. A 40 nm space width was obtained.

Example 6

Resist C Formulation

This formulation was prepared and processed in a manner similar to Example 4. However, it is comprised of the following components:
Poly(4-hydroxystyrene-co-4-(1-methoxycyclohexyloxy) styrene-co-styrene) (69:16:15) in PGMEA, 89.7% of solids;
TPSTf, 2.2% of solids;
TBIC, 2.2% of solids;
Powderlink, 5.4% of solids; and
TBAH, 0.5% of solids; and
sufficient PGMEA containing 500 ppm FC-430 surfactant as a solvent to form a 4.3% solids solution.

The solution was filtered through a 0.2 µm filter. The solution was coated onto silicon wafers which was pre-coated with 35 nm of SHB-A940, available from Shin-Etsu Chemical Co., Ltd., on top of 200 nm HM8006, available from Japan Synthetic Rubber Co., Ltd., with a soft bake of 105 Celsius (° C.) for 60 sec resulting in films of about 120 nm thick. The coated wafer was then exposed to 248 nm wavelength light on an ASML stepper with a binary reticle using 0.8 NA and 0.6 sigma illumination condition. The wafer was then baked at 105° C. for 60 seconds. It was developed using a 30 seconds single puddle develop process with 0.263 N TMAH developer. A 98 nm space width was obtained.

Example 7

Resist D Formulation

This formulation was prepared and processed in a manner similar to Example 4. However, it is comprised of the following components:
Poly(4-hydroxystyrene-co-4-(1-methoxycyclohexyloxy) styrene-co-styrene) (69:16:15) in PGMEA, 89.6% of solids;
TPSTf, 3.0% of solids;
TBIC, 1.5% of solids;
Powderlink, 5.4% of solids; and
TBAH, 0.5% of solids; and
sufficient PGMEA containing 500 ppm FC-430 surfactant as a solvent to form a 4.3% solids solution.

The solution was filtered through a 0.2 µm filter. The solution was coated onto silicon wafers which was pre-coated with 35 nm of SHB-A940, available from Shin-Etsu Chemical Co., Ltd., on top of 200 nm HM8006, available from Japan Synthetic Rubber Co., Ltd., with a soft bake of 105 Celsius (° C.) for 60 sec resulting in films of about 120 nm thick. The coated wafer was then exposed to 248 nm wavelength light on an ASML stepper with a binary reticle using 0.8 NA and 0.6 sigma illumination condition. The wafer was then baked at 105° C. for 60 seconds. It was developed using a 30 seconds single puddle develop process with 0.263 N TMAH developer. A 85 nm space width was obtained.

Example 8

Resist E Formulation

This formulation was prepared and processed in a manner similar to Example 4. However, it is comprised of the following components:
Poly(4-hydroxystyrene-co-4-(1-methoxycyclohexyloxy) styrene-co-styrene) (69:16:15) in PGMEA, 89.6% of solids;
TPSTf, 4.0% of solids;
TBIC, 0.4% of solids;
Powderlink, 5.4% of solids; and
TBAH, 0.5% of solids; and
sufficient PGMEA containing 500 ppm FC-430 surfactant as a solvent to form a 4.3% solids solution.

The solution was filtered through a 0.2 µm filter. The solution was coated onto silicon wafers which was pre-coated with 35 nm of SHB-A940, available from Shin-Etsu Chemical Co., Ltd., on top of 200 nm HM8006, available from Japan Synthetic Rubber Co., Ltd., with a soft bake of 105 Celsius (° C.) for 60 sec resulting in films of about 120 nm thick. The coated wafer was then exposed to 248 nm wavelength light on an ASML stepper with a binary reticle using 0.8 NA and 0.6 sigma illumination condition. The wafer was then PEB at 105° C. for 60 seconds. It was developed using a 30 seconds single puddle develop process with 0.263 N TMAH developer. A 44 nm space width was obtained.

Example 9

Resist F Formulation

This formulation was prepared and processed in a manner similar to Example 4. However, it is comprised of the following components:
Poly(4-hydroxystyrene-co-4-(1-methoxycyclohexyloxy) styrene-co-styrene) (69:16:15) in PGMEA, 89.6% of solids;
TPSTf, 4.5% of solids;
Powderlink, 5.4% of solids; and
TBAH, 0.5% of solids; and
sufficient PGMEA containing 500 ppm FC-430 surfactant as a solvent to form a 4.3% solids solution.

The solution was filtered through a 0.2 µm filter. The solution was coated onto silicon wafers which was pre-coated with 35 nm of SHB-A940, available from Shin-Etsu Chemical Co., Ltd., on top of 200 nm HM8006, available from Japan Synthetic Rubber Co., Ltd., with a soft bake of 105 Celsius (° C.) for 60 sec resulting in films of about 120 nm thick. The coated wafer was then exposed to 248 nm wavelength light on an ASML stepper with a binary reticle using 0.8 NA and 0.6 sigma illumination condition. The wafer was then baked at 105° C. for 60 seconds. It was developed using a 30 seconds single puddle develop process with 0.263 N TMAH developer. A 35 nm space width was obtained.

Changing the illumination condition to 0.8 NA and 0.7 sigma under the above condition resulted a space width of 30 nm. Further changing the illumination condition to 0.8 NA and 0.8 sigma resulted a space width of 25 nm.

Example 10

Resist G Formulation

This formulation was prepared and processed in a manner similar to Example 4. However, it is comprised of the following components:

Poly(4-hydroxystyrene-co-4-(1-methoxycyclohexyloxy) styrene-co-styrene) (68:17:15) in PGMEA, 89.6% of solids;

TPSTf, 3.0% of solids;

TBIC, 1.5% of solids;

Powderlink, 5.4% of solids; and

TBAH, 0.5% of solids; and sufficient PGMEA containing 500 ppm FC-430 surfactant as a solvent to form a 4.3% solids solution.

The solution was filtered through a 0.2 μm filter. The solution was coated onto silicon wafers which was pre-coated with 35 nm of SHB-A940, available from Shin-Etsu Chemical Co., Ltd., on top of 200 nm HM8006, available from Japan Synthetic Rubber Co., Ltd., with a soft bake of 105 Celsius (° C.) for 60 sec resulting in films of about 120 nm thick. The coated wafer was then exposed to 248 nm wavelength light on an ASML stepper with a binary reticle using 0.8 NA and 0.6 sigma illumination condition. The wafer was then PEB at 105° C. for 60 seconds. It was developed using a 30 seconds single puddle develop process with 0.263 N TMAH developer. A 35 nm space width was obtained.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A photoresist composition comprising:
    a first photoacid generator, wherein the first photoacid generator has a first activation energy level;
    a second photoacid generator, wherein the second photoacid generator has a second activation energy level, and wherein the second activation energy level is different than the first activation energy level;
    a negative crosslinking agent;
    and a polymer having a hydrophobic monomer unit and a hydrophilic monomer unit containing a hydroxyl group, wherein at least some of the hydroxyl groups are protected with an acid labile moiety having a low activation energy.

2. The photoresist composition of claim 1, wherein the concentration of the hydrophobic monomer unit in the polymer is from about 7 mole % to about 60 mole %.

3. The photoresist composition of claim 1, wherein the acid labile moiety comprises one of an acetal, a ketal and an orthoester.

4. The photoresist composition of claim 1, wherein from about 7 mole % to about 100 mole % of the hydroxyl groups are protected by the acid labile moiety.

5. The photoresist composition of claim 1, wherein the hydrophobic monomer unit is derived from a monomer selected from a group consisting of:

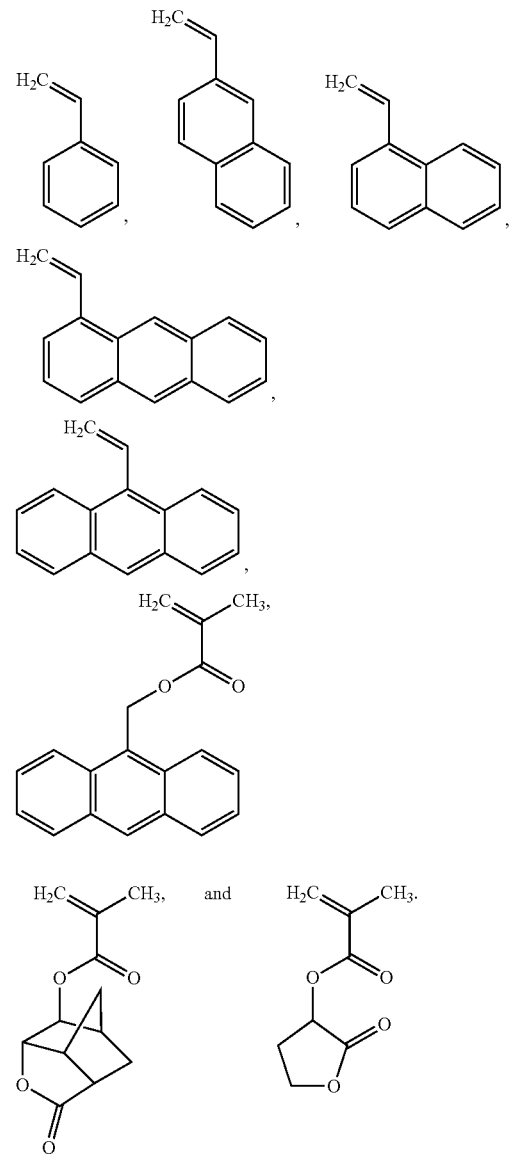

6. The photoresist composition of claim 1, wherein the hydrophilic monomer unit is derived from a monomer selected from a group consisting of:

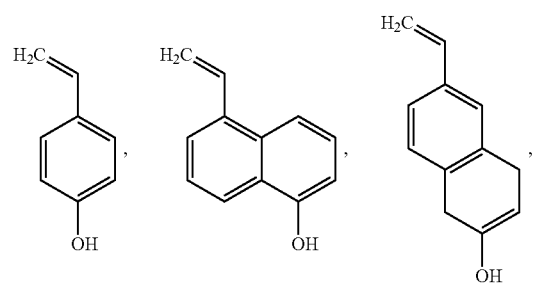

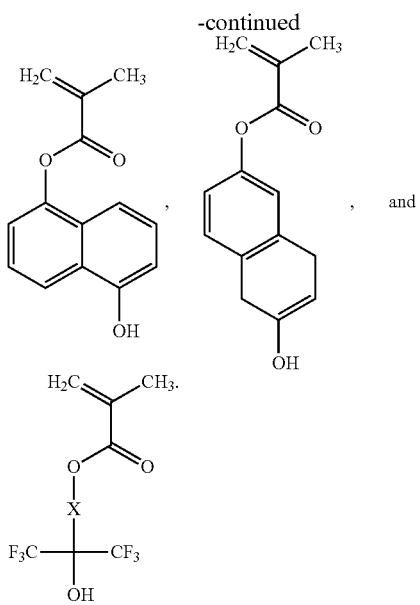

wherein X represents a liner, branched aliphatic chain with 1-12 carbons or a cyclic aliphatic ring of 1-10 carbons.

7. The photoresist composition of claim 1, wherein the first photoacid generator and the second photoacid generator each comprise at least one of an onium salt, a succinimide derivative, a diazo compound, and a nitrobenzyl compound.

8. The photoresist composition of claim 1, further comprising at least one of a solvent, a quencher, and a surfactant.

9. The photoresist composition of claim 8, comprising:
about 1 to about 30 wt. % of the polymer;
about 0.5 to about 30 wt. % of the combination of the first photoacid generator and the second photoacid generator, based on the total weight of the polymer;
about 1 to about 30 wt. % of the cros slinking agent, based on the total weight of the polymer; and
about 70 to about 99 wt. % of the solvent.

10. The photoresist composition of claim 1, wherein the negative crosslinking agent comprises a compound selected from the group consisting of glycoluril compounds, 2,6-bis (hydroxymethyl)-p-cresol compounds, etherified amino resins, methylated melamine resins, butylated melamine resins, bis-epoxies, and bisphenols.

11. The photoresist composition of claim 10, wherein the glycoluril compound comprises a compound selected from the group consisting of glycoluril, methylpropyltetramethoxymethyl glycoluril, or methylphenyltetramethoxymethyl glycoluril.

12. The photoresist composition of claim 1, wherein the negative crosslinking agent comprises a compound selected from the group consisting of:

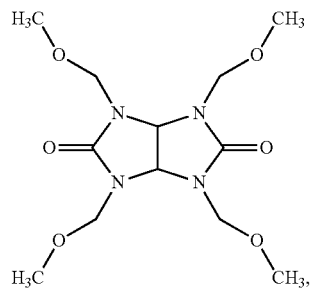

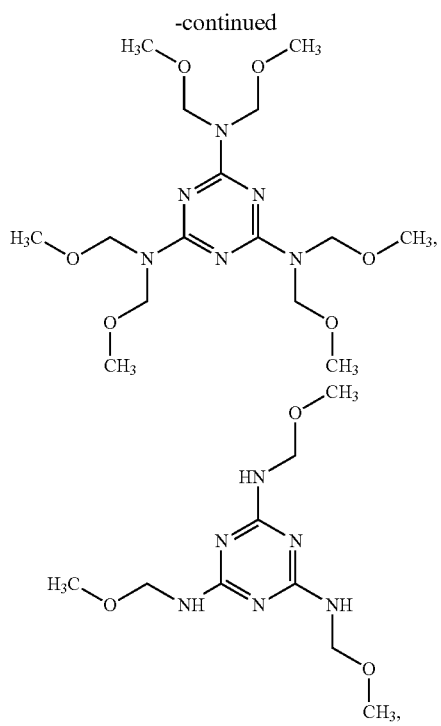

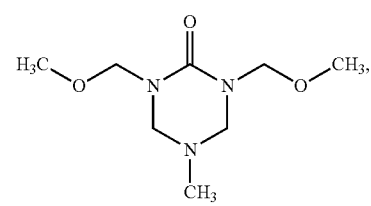

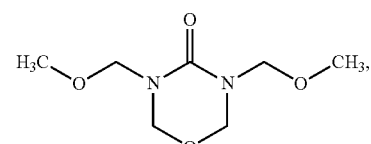

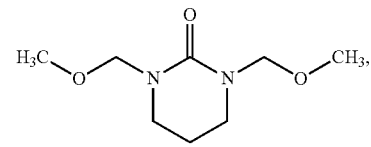

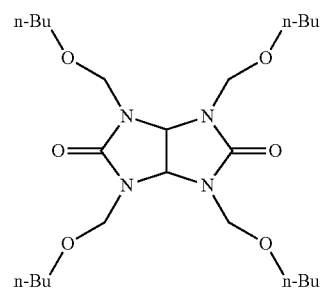

-continued

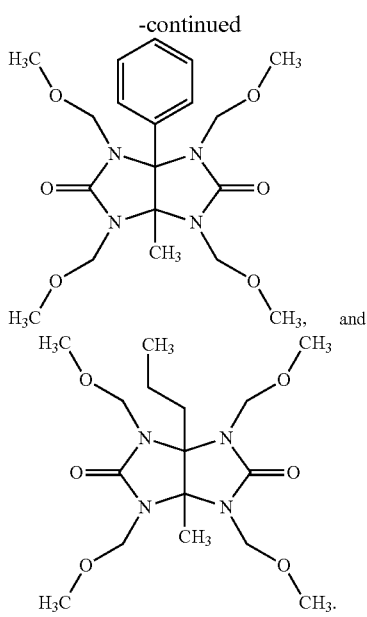

13. The photoresist composition of claim 1, wherein the first photoacid generator comprises triphenyl sulfonium triflate (TPSTf).

14. The photoresist composition of claim 1, wherein the second photoacid generator comprises di(t-butylphenyl)iodonium camphorsonate (TBIC).

15. The photoresist composition of claim 1, comprising 2.2 wt % of the first photoacid generator and 2.2 wt % of the second photoacid generator.

16. The photoresist composition of claim 1, comprising 3.0 wt % of the first photoacid generator and 1.5 wt % of the second photoacid generator.

17. The photoresist composition of claim 1, comprising 4.0 wt % of the first photoacid generator and 0.4 wt % of the second photoacid generator.

18. The photoresist composition of claim 1, wherein the photoresist composition is capable of producing a combination of a positive tone response and a negative tone response to a single exposure.

* * * * *